US011714437B2

(12) United States Patent
Minotani et al.

(10) Patent No.: US 11,714,437 B2
(45) Date of Patent: Aug. 1, 2023

(54) VARIABLE REFERENCE VOLTAGE SOURCE

(71) Applicant: Nippon Telegraph and Telephone Corporation, Tokyo (JP)

(72) Inventors: Tadashi Minotani, Musashino (JP); Kenichi Matsunaga, Musashino (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 79 days.

(21) Appl. No.: 17/610,097

(22) PCT Filed: May 28, 2019

(86) PCT No.: PCT/JP2019/021082
§ 371 (c)(1),
(2) Date: Nov. 9, 2021

(87) PCT Pub. No.: WO2020/240693
PCT Pub. Date: Dec. 3, 2020

(65) Prior Publication Data
US 2022/0236753 A1 Jul. 28, 2022

(51) Int. Cl.
*G05F 1/46* (2006.01)

(52) U.S. Cl.
CPC .................................. *G05F 1/46* (2013.01)

(58) Field of Classification Search
None
See application file for complete search history.

(56) References Cited

U.S. PATENT DOCUMENTS

| 9,859,887 B2* | 1/2018 | Chiou | G01R 27/02 |
| 11,326,942 B2* | 5/2022 | Xu | G01J 1/46 |
| 11,368,162 B2* | 6/2022 | Minotani | G01R 19/00 |

(Continued)

OTHER PUBLICATIONS

Rahul Prakash and Kunal Gandhi, *Trimming to Improve DAC Accuracy* (1/3), EDN Japan, Nov. 10, 2016, http://ednjapn.com/edn/articles/1611/08/news012.html, pp. 1-11.

(Continued)

*Primary Examiner* — Thomas J. Hiltunen
(74) *Attorney, Agent, or Firm* — Workman Nydegger

(57) ABSTRACT

A variable reference voltage source that generates a variable reference voltage corresponding to setting data set from outside includes a control unit including a calibration control unit that controls operation for acquiring calibration data including calibration values of an offset voltage and a predetermined unit voltage of a determiner, which determines magnitudes of two voltages, and an output control unit that controls operation for generating, based on the calibration data, a variable reference voltage corresponding to the setting data set from the outside, a reference voltage unit that outputs a reference voltage, and an integrated-voltage generating unit that repeats, when the calibration control unit controls the operation, an integrating operation until an integrated voltage obtained by integrating at least two or more kinds of unit voltages becomes equal to the reference voltage and outputs, when the output control unit controls the operation, the variable reference voltage corresponding to the setting data.

6 Claims, 6 Drawing Sheets

(56) References Cited

U.S. PATENT DOCUMENTS

| | | | | |
|---|---|---|---|---|
| 2022/0014094 A1* | 1/2022 | Minotani | ............ | H03F 3/45475 |
| 2022/0337262 A1* | 10/2022 | Minotani | ................ | H03M 1/10 |
| 2022/0393696 A1* | 12/2022 | Minotani | ............ | G01R 19/257 |
| 2023/0006686 A1* | 1/2023 | Minotani | ................ | H03M 1/52 |
| 2023/0012330 A1* | 1/2023 | Michel | ................. | G04F 10/005 |

OTHER PUBLICATIONS

Macnica, Inc., *Back Trick! Realize a Pseudo D / A Converter Using PWM*, Macnica Online Service, Apr. 21, 2015, https://service.macnica.co,jp/library/107577, pp. 1-2.

* cited by examiner

VARIABLE REFERENCE VOLTAGE SOURCE

TECHNICAL FIELD

The present invention relates to a variable reference voltage source that does not require a measuring instrument for calibration.

BACKGROUND ART

A voltage source for calibration that outputs a known voltage is used for, for example, calibration of a sensor circuit that detects something. A correspondence relation between a digital value and a sensing target signal changes because of changes with time of an offset and a gain of an amplifier, an offset, linearity, and the like of an AD converter of the sensor circuit. In order to suppress the change without increasing maintenance operation, calibration of the amplifier and the AD converter is necessary. In the calibration of the offset and the gain of the amplifier and the offset of the AD converter, the known voltage is input to the amplifier and the calibration is performed according to a correlation between the known voltage and outputs of the amplifier and the AD converter.

Examples of a variable signal source that outputs a known voltage include an R-2R ladder circuit, a resistance string circuit (Non-Patent Literature 1), and a PWM circuit (Non-Patent Literature 2). The R-2R ladder circuit can configure a high-resolution and high-accuracy variable signal source with a relatively small number of resistance elements. The resistance string circuit has low power consumption and monotonicity. The PWM circuit has an advantage that performance is stable because the PWM circuit is configured by only a digital circuit.

CITATION LIST

Non-Patent Literature

Non-Patent Literature 1: Trimming for improving accuracy of a DAC (⅓) EDN Japan [searched on May 16, 2019], Internet (URL: http://ednjapn.com/edn/articles/1611/08/news012.html)

Non-Patent Literature 2: Secret trick! Realize a pseudo D/A converter using PWM [searched on May 16, 2019], Internet (URL: https://service.macnica.co.jp/library/107577)

SUMMARY OF THE INVENTION

Technical Problem

However, in order to improve the accuracy of these signal sources, it is necessary to prepare, on the outside of the signal sources, a measuring instrument serving as a reference and adjusting the signal sources. The R-2R circuit and the resistance string circuit need to finely adjust a value of the resistance element using the measuring instrument on the outside. In the PWM circuit, high accuracy is requested for frequency accuracy of a high-order low-pass filter for removing ripple noise appearing in an output. Therefore, adjustment using the measuring instrument on the outside is necessary.

In order to use the conventional signal source as a reference in this way, there is a problem in that work for preparing the measuring instrument on the outside of the reference signal source and adjusting the reference signal source is essential.

The present invention has been devised in view of this problem and an object of the present invention is to provide a variable reference voltage source for which a measuring instrument for calibration is unnecessary.

Means for Solving the Problem

A variable reference voltage source according to an aspect of the present invention is a variable reference voltage source that generates a variable reference voltage corresponding to setting data set from outside, the variable reference voltage source including: a control unit including a calibration control unit that controls operation for acquiring calibration data including calibration values of an offset voltage and a predetermined unit voltage of a determiner, which determines magnitudes of two voltages, and an output control unit that controls operation for generating, based on the calibration data, a variable reference voltage corresponding to the setting data set from the outside; a reference voltage unit that outputs a reference voltage; and an integrated-voltage generating unit that repeats, when the calibration control unit controls the operation, an integrating operation until an integrated voltage obtained by integrating at least two or more kinds of unit voltages becomes equal to the reference voltage and outputs, when the output control unit controls the operation, the variable reference voltage corresponding to the setting data.

Effects of the Invention

According to the present invention, it is possible to provide a variable reference voltage source for which a measuring instrument for calibration on the outside is unnecessary.

DESCRIPTION OF EMBODIMENTS

Figure 1:
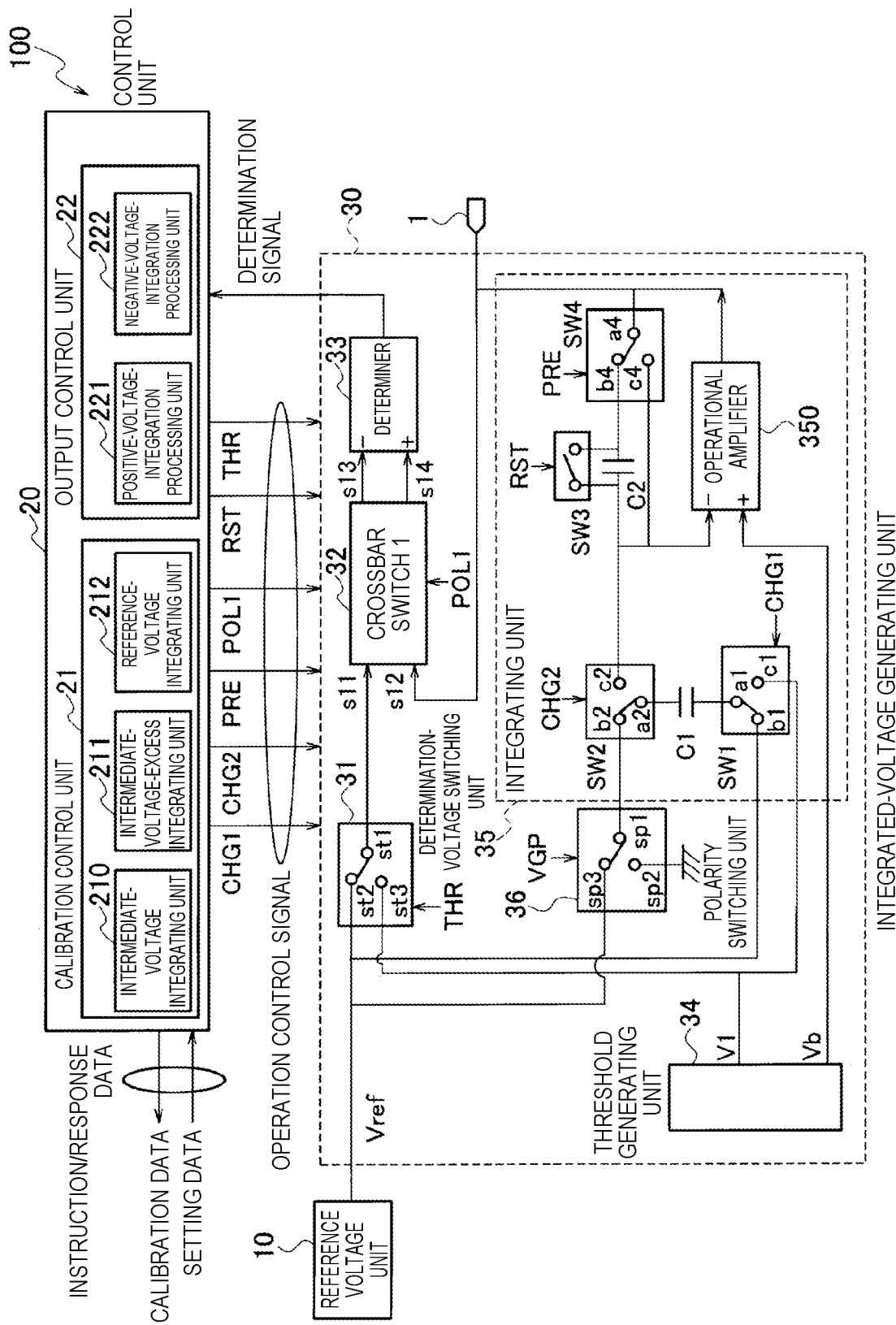
FIG. 1 is a functional block diagram showing a configuration example of a variable reference voltage source according to an embodiment of the present invention.

An embodiment of the present invention is explained below with reference to the drawings. The same components in a plurality of drawings are denoted by the same reference numerals and signs. Explanation of the components is not repeated.

FIG. 1 is a functional block diagram showing a functional configuration example of a variable reference voltage source according to the embodiment of the present invention. A variable reference voltage source 100 shown in FIG. 1 generates a variable reference voltage corresponding to setting data set from the outside and outputs the variable reference voltage to an output 1. The variable reference voltage source 100 includes a reference voltage unit 10, a control unit 20, and an integrated-voltage generating unit 30 having a plurality of unit voltages. The reference voltage unit 10 outputs a reference voltage Vref.

An offset and a predetermined unit voltage are included in the integrated-voltage generating unit 30 on the inside of the variable reference voltage source 100 and change with time because of a drift. Therefore, in order to keep accuracy, it is necessary to calibrate the offset and the unit voltage as explained below. The control unit 20 includes a calibration control unit 21 that controls operation for acquiring calibration data including calibration values of the offset and the predetermined unit voltage of the integrated-voltage generating unit 30 and an output control unit 22 that controls operation for generating a variable reference voltage corresponding to setting data set from the outside based on the calibration data.

The integrated-voltage generating unit 30 repeats, when the calibration control unit 21 controls the operation, an integrating operation until an integrated voltage obtained by integrating the predetermined unit voltage becomes equal to the reference voltage Vref and outputs, when the output control unit 22 controls the operation, a variable reference voltage corresponding to the setting data.

The integrated-voltage generating unit 30 includes an integrating unit 35, a determiner 33, a crossbar switch 32, a threshold generating unit 34, a determination-voltage switching unit 31, and a polarity switching unit 36. The integrating unit 35 generates an integrated voltage obtained by integrating a unit voltage. The determiner 33 includes positive and negative inputs, determines that a positive input voltage exceeds a negative input voltage at a calibration state time, and outputs a determination signal. The crossbar switch 32 is used for measurement of an offset voltage of the determiner 33. The threshold generating unit 34 generates a bias voltage Vb and an intermediate potential V1 of the integrating unit 35. The determination-voltage switching unit 31 switches a voltage serving as a reference given to the determiner 33 through the crossbar switch 33 at the calibration state time. The polarity switching unit 36 switches a polarity of the unit voltage.

The integrating unit 35 is configured by an operational amplifier 350 including positive and negative inputs, an SW4, an SW1, an SW2, a capacitor C1, a capacitor C2, and a SW3. The SW4 switches an integrating operation and an operation as a unity gain buffer of the operational amplifier 350. The SW1 and the SW2 switch the magnitude of the unit voltage and a polarity at the time of a small unit voltage. The capacitor C1 accumulates electric charges equivalent to one unit voltage. The capacitor C2 accumulates electric charges equivalent to an integrated voltage. The SW3 is used when the electric charges accumulated in the capacitor C2 are reset.

Connection of the SW1, SW2, SW3, and SW4, the polarity switching unit 36, the determination-voltage switching unit 31, and the crossbar switch 32 is controlled according to CHG1, CHG2, RST, PRE, VGP, THR, and POL, which are operation control signals from the control unit 20.

In the integrating unit 35, integration processing at two kinds of unit voltages having different magnitudes and different polarities is possible. In the following explanation, a relation between operations and the numbers of times of integration at the unit voltages and an output of the operational amplifier 350 is explained and, thereafter, operation of calibration processing is explained. In the following explanation, integration processing at a small unit voltage having a positive polarity is described as first positive integration processing, integration processing at a small unit voltage having a negative polarity is described as first negative integration processing, integration processing at a large unit voltage having a positive polarity is described as second positive integration processing, and integration processing at a large unit voltage having a negative polarity is described as second negative integration processing.

Operation of the first positive integration processing is explained. This processing is configured by a first positive comparison step, a first positive charge accumulation step, and a first positive charge transfer step. In this processing, sp1 and sp2 of the polarity switching unit 36 are connected. In the first positive comparison step, connection of a1 and b1 of the SW1, connection of a2 and b2 of the SW2, and connection of a4 and b4 of the SW4 are carried out. When an output of the operational amplifier 350 is represented as Vsp,0, electric charges Q1,0 and Q2,0 accumulated in the capacitor C1 and the capacitor C2 are respectively represented by the following expressions.

Math. 1
$$Q1,0 = C1\ Vref \tag{1}$$
$$Q2,0 = C2\left\{\frac{A+1}{A}Vsp,0 - (Vofop + Vb)\right\} \tag{2}$$

In Expression (2), A represents a gain of the operational amplifier 350 and Vofop represents an offset voltage of the operational amplifier 350. When parasitic capacitance Cp connected to a negative input of the operational amplifier 350 and affecting the operation of the integration processing is considered, electric charges Qp,0 accumulated in Cp are represented by the following expression.

Math. 2
$$Qp,0 = Cp\left(-\frac{Vsp,0}{A} + Vofop + Vb\right) \tag{3}$$

In the first positive charge accumulation step, after a4 and c4 of the SW4 are connected, a2 and c2 of the SW2 are connected. Electric charges accumulated in C2 are saved by connecting a4 and c4 of the SW4. The operational amplifier 350 operates as a unity gain buffer. An output Vspa,1 of the operational amplifier 350 at this time is represented by the following expression.

Math. 3
$$Vspa,1 = \frac{A}{A+1}(Vofop + Vb) \tag{4}$$

A differential voltage between the reference voltage Vref and Vspa,1 is applied to the capacitor C1. Electric charges Q1a,1, Q2a,1, and Qpa,1 accumulated in the capacitor C1, the capacitor C2, and Cp in this step are represented by the following expressions.

Math. 4

$$Q1a, 1 = C1\left\{Vref - \frac{A}{A+1}(Vofop + Vb)\right\} \quad (5)$$

$$Q2a, 1 = Q2,0 = C2\left(\frac{A}{A+1}Vsp, 0 - Vofop - Vb\right) \quad (6)$$

$$Qpa, 1 = Cp\frac{A}{A+1}(Vofop + Vb) \quad (7)$$

In the first positive charge transfer step, after a4 and b4 of the SW4 are connected, a1 and c1 of the SW1 are connected. Since c1 of the SW1 is connected to V1, when an output of the operational amplifier 350 is represented as Vspb,1, electric charges Q1b,1, Q2b,1, and Qpb,1 accumulated in the capacitor C1, the capacitor C2, and Cp in this step are represented by the following expressions.

Math. 5

$$Q1b, 1 = C1\left\{V1 + \frac{1}{A}Vspb, 1 - (Vofop + Vb)\right\} \quad (8)$$

$$Q2b, 1 = C2\left\{\frac{A+1}{A}Vspb, 1 - (Vofop + Vb)\right\} \quad (9)$$

$$Qpb, 1 = Cp\left\{-\frac{1}{A}Vspb, 1 + (Vofop + Vb)\right\} \quad (10)$$

Electric charges accumulated in a capacitor connected to the negative input of the operational amplifier 350 before and after the first positive charge transfer step are saved. Accordingly, a relational expression between Vspb,1 and Vsp,0 is as follows.

Math. 6

$$-Q1a, 1 + Qpa, 1 - Q2a, 1 = -Q1b, 1 + Qpb, \quad (11)$$

$$1 - Q2b, 1 - C1\left\{Vref - \frac{A}{A+1}(Vofop + Vb)\right\} +$$

$$Cp\frac{A}{A+1}(Vofop + Vb) - C2\left(\frac{A+1}{A}Vsp, 0 - Vofop - Vb\right) =$$

$$-C1\left(V1 + \frac{1}{A}Vspb, 1 - Vofop - Vb\right) +$$

$$Cp\left(-\frac{1}{A}Vspb, 1 + Vofop + Vb\right) - C2\left(\frac{A+1}{A}Vspb, 1 - Vofop - Vb\right)$$

$$\left(\frac{C1}{A} + \frac{Cp2}{A} + \frac{A+1}{A}C2\right)Vspb,$$

$$1 = C1\left\{Vref - V1 + \frac{1}{A+1}(Vofop + Vb)\right\} + C2\frac{A+1}{A}Vsp,$$

$$0 + Cp\frac{1}{A+1}(Vofop + Vb)$$

$$Vspb, 1 = \frac{AC1}{C1 + Cp + (A+1)C2}\left\{Vref - V1 + \frac{1}{A+1}(Vofop + Vb)\right\} +$$

$$\frac{(A+1)C2}{C1 + Cp + (A+1)C2}Vsp, 0 + \frac{Cp}{C1 + Cp + (A+1)C2}\frac{A}{A+1}(Vofop + Vb)$$

A relation between the output Vsp,1 of the operational amplifier 350 and the electric charges Q2,1 and Qp,1 accumulated in the capacitor C2 and Cp at the time when the processing transitions to the first positive comparison step again is an expression obtained by replacing Vsp,0 and Q2,0 and Qp,0 in Expression (2) and Expression (3) with Vsp,1 and Q2,1 and Qp,1. According to this relational expression, Vsp,1 and Vspb,1 are equal as follows.

Math. 7

$$Qpb, 1 - Q2b, 1 = Qp, 1 - Q2, 1$$

$$Cp\left\{-\frac{1}{A}Vspb, 1 + (Vofop + Vb)\right\} - C2\left\{\frac{A+1}{A}Vspb, 1 - (Vofop + Vb)\right\} =$$

$$Cp\left(-\frac{Vsp, 1}{A} + Vofop + Vb\right) - C2\left\{\frac{A+1}{A}Vsp, 1 - (Vofop + Vb)\right\}$$

$$Vspb, 1 = Vsp, 1$$

Accordingly, a relation between Vsp,1 and Vsp,0 is represented by the following expression.

Math. 8

$$Vsp, 1 = \frac{AC1}{C1 + Cp + (A+1)C2}\left\{Vref - V1 + \frac{1}{A+1}(Vofop + Vb)\right\} + \quad (12)$$

$$\frac{(A+1)C2}{C1 + Cp + (A+1)C2}Vsp, 0 + \frac{Cp}{C1 + Cp + (A+1)C2}\frac{A}{A+1}(Vofop + Vb)$$

Expression (12) can be represented in the following form of a geometrical series.

Math. 9

$$Vsp,1+Bsp0=Bsp1(Vsp,0+Bsp0)$$

$$Vsp,1=Bsp1 Vsp,0+(Bsp1-1)Bsp0 \quad (13)$$

According to comparison of Expression (12) and Expression (13), Bsp1 is represented by the following expression.

Math. 10

$$Bsp1 = \frac{(A+1)C2}{C1 + Cp + (A+1)C2} = 1 - \frac{C1 + Cp}{C1 + Cp + (A+1)C2} = 1 - \eta sp \quad (14)$$

$$\eta sp = \frac{C1 + Cp}{C1 + Cp + (A+1)C2} \quad (15)$$

(Bsp1−1)Bsp0=−ηsp Bsp0 is represented by the following expression.

Math. 11

$$-\eta sp Bsp0 = \frac{AC1}{C1 + Cp + (A+1)C2}\left\{Vref - V1 + \frac{1}{A+1}(Vofop + Vb)\right\} + \quad (16)$$

$$\frac{Cp}{C1 + Cp + (A+1)C2}\frac{A}{A+1}(Vofop + Vb)$$

A voltage Vsp,k of the operational amplifier 350 at the time when the first positive integration processing is repeated k times is represented by the following expression.

Math. 12

$$Vsp,k+Bsp0=Bsp1^k(Vsp,0+Bsp0)=(1-\eta sp)^k(Vsp,0+Bsp0)$$

$$Vsp,k=(1-\eta sp)^k(Vsp,0+Bsp0)-Bsp0 \quad (17)$$

Operation of the first negative integration processing is explained. This processing is configured by a first negative comparison step, a first negative charge accumulation step, and a first negative charge transfer step. In this processing, sp1 and sp2 of the polarity switching unit 36 are connected. In the first negative comparison step, connection of a1 and c1 of the SW1, connection of a2 and b2 of the SW2, and connection of a4 and b4 of the SW4 are carried out. When a voltage of the operational amplifier 350 at this time is represented as Vsn,0, electric charges accumulated in the capacitor C2 and Cp are represented by expressions obtained by replacing Vsp,0 on the right sides of Expression (2) and Expression (3) with Vsn,0.

In the first negative charge accumulation step, after a4 and c4 of the SW4 are connected, a2 and c2 of the SW2 are connected. When an output of the operational amplifier 350 is represented as Vsna,1, a differential voltage between the reference voltage V1 and Vsna,1 is applied to the capacitor C1. Electric charges Q1a,1 accumulated in the capacitor C1 in this step are represented by the following expression.

Math. 13

$$Q1a, 1 = C1\left\{V1 - \frac{A}{A+1}(Vofop + Vb)\right\} \quad (18)$$

Electric charges accumulated in the capacitor C2 are represented by an expression obtained by replacing sp,0 on the right side of Expression (6) with Vsn,0. Electric charges accumulated in Cp are represented by Expression (7).

In the first negative charge transfer step, after a4 and b4 of the SW4 are connected, a1 and b1 of the SW1 are connected. When an output of the operational amplifier 350 at this time is represented as Vsnb,1, electric charges accumulated in the capacitor C1 are represented by the following expression.

Math. 14

$$Q1b, 1 = C1\left\{Vref + \frac{1}{A}Vsnb, 1(Vofop + Vb)\right\} \quad (19)$$

Electric charges accumulated in the capacitor C2 and Cp are represented by expressions obtained by replacing Vspb,1 on the right sides of Expression (9) and Expression (10) with Vsnb,1. Electric charges accumulated in the capacitor connected to the negative input of the operational amplifier 350 before and after the first negative charge transfer step are saved. Accordingly, a relational expression between Vsnb,1 and Vsn,0 is as follows.

Math. 15

$$-Q1a, 1 + Qpa, 1 - Q2a, 1 = -Q1b, 1 + Qpb, 1 - Q2b,$$

$$1 - C1\left\{V1 - \frac{A}{A+1}(Vofop + Vb)\right\} + Cp\frac{A}{A+1}(Vofop + Vb) -$$

$$C2\left(\frac{A+1}{A}Vsn, 0 - Vofop - Vb\right) = -C1\left(Vref + \frac{1}{A}Vsnb, 1 - Vofop - Vb\right) +$$

$$Cp\left(-\frac{1}{A}Vsnb, 1 + Vofop + Vb\right) - C2\left(\frac{A+1}{A}Vsnb, 1 - Vofop - Vb\right)$$

$$\left(\frac{C1}{A} + \frac{Cp2}{A} + \frac{A+1}{A}C2\right)Vsnb,$$

$$1 = C1\left\{V1 - Vref + \frac{1}{A+1}(Vofop + Vb)\right\} + C2\frac{A+1}{A}Vsn,$$

$$0 + Cp\frac{1}{A+1}(Vofop + Vb)$$

$$Vsnb, 1 = \frac{AC1}{C1 + Cp + (A+1)C2}\left\{-Vref + V1 + \frac{1}{A+1}(Vofop + Vb)\right\} +$$

$$\frac{(A+1)C2}{C1 + Cp + (A+1)C2}Vsp, 0 + \frac{Cp}{C1 + Cp + (A+1)C2}\frac{A}{A+1}(Vofop + Vb)$$

An output Vsn,1 of the operational amplifier 350 and Vsnb,1 at the time when the processing transitions to the first positive comparison step again are equal. Therefore, a relational expression between Vsn1 and Vsn,0 is represented by the following expression.

Math. 16

$$Vsn, 1 = \frac{AC1}{C1 + Cp + (A+1)C2}\left\{-Vref + V1 + \frac{1}{A+1}(Vofop + Vb)\right\} + \quad (20)$$

$$\frac{(A+1)C2}{C1 + Cp + (A+1)C2}Vsp, 0 + \frac{Cp}{C1 + Cp + (A+1)C2}\frac{A}{A+1}(Vofop + Vb)$$

According to the same development of formula as that in the first positive integration processing, a voltage Vsn,k of the operational amplifier 350 at the time when the first negative integration processing is repeated k times is represented by the following expression.

Math. 17

$$Vsn, k = (1 - \eta sn)^k (Vsn, 0 + Bsn0) - Bsn0 \quad (21)$$

$$\eta sn = \frac{C1 + Cp}{C1 + Cp + (A+1)C2} = \eta sp - \eta snBsn0 = \quad (22)$$

$$\frac{AC1}{C1 + Cp + (A+1)C2}\left\{-Vref + V1 + \frac{1}{A+1}(Vofop + Vb)\right\} +$$

$$\frac{Cp}{C1 + Cp + (A+1)C2}\frac{A}{A+1}(Vofop + Vb) \quad (23)$$

Operation of the second positive integration processing is explained. This processing is configured by a second positive charge accumulation/comparison step and a second positive charge transfer step. In this processing, sp1 and sp2 of the polarity switching unit are connected and a4 and b4 of the SW4 are connected. In the second positive charge accumulation/comparison step, a1 and b1 of the SW1 are connected and a2 and b2 of the SW2 are connected. When an output of the operational amplifier 350 is represented as Vlp,0, electric charges Q2,0 and Qp,0 accumulated in the capacitor C2 and Cp are represented by expressions obtained by replacing Vsp,0 on the right sides of Expression (2) and Expression (3) with Vlp,0. Electric charges accumulated in the capacitor C1 are represented by Expression (1).

In the second positive charge transfer step, a2 and c2 of the SW2 are connected. When an output of the operational amplifier 350 at this time is represented as Vlpa,1, electric charges Q2a,1 and Qpa,1 accumulated in the capacitor C2 and Cp are represented by expressions obtained by replacing Vspb.1 on the right sides of Expression (9) and Expression (10) with Vlpa,1. In the electric charges Q1a,1 accumulated in the capacitor C1, since connection of the SW1, the SW2, and the SW4 is the same as that in the first negative integration processing, Q1a,1 is represented by an expression obtained by replacing Vsnb,1 on the right side of Expression (19) with Vlpa,1. A relational expression between Vlp,0 and Vlpa,1 is represented by the following expression.

Math. 18

$$-Q1a, 1 + Qpa, 1 - Q2a, 1 = -Q1, 1 + Qp, 1 - Q2,$$

-continued $$1 - C1\left\{Vref + \frac{1}{A}Vlpa, 1 - (Vofop + Vb)\right\} +$$

$$Cp\left\{-\frac{1}{A}Vlpa, 1 + (Vofop + Vb)\right\} - C2\left\{\frac{A+1}{A}Vlpa, 1 - (Vofop + Vb)\right\} =$$

$$-C1Vref + Cp\left(-\frac{Vlp,0}{A} + Vofop + Vb\right) - C2\left\{\frac{A+1}{A}Vlp, 0 - (Vofop + Vb)\right\}$$

$$\left(\frac{C1}{A} + \frac{Cp2}{A} + \frac{A+1}{A}C2\right)Vlpa,$$

$$1 = C1(Vofop + Vb) + \left(\frac{Cp2}{A} + C2\frac{A+1}{A}\right)Vlp, 0$$

$$Vlpa, 1 = \frac{AC1}{C1 + Cp + (A+1)C2}(Vofop + Vb) + \frac{Cp + (A+1)C2}{C1 + Cp + (A+1)C2}Vlp, 0$$

A voltage Vlp,1 of the operational amplifier 350 and Vlpa1 at the time when the processing transitions to the second positive charge accumulation/comparison step again are equal. Therefore, a relational expression between Vlp,1 and Vlp,0 is represented by the following expression.

Math. 19

$$Vlp,$$

$$1 = \frac{AC1}{C1 + Cp + (A+1)C2}(Vofop + Vb) + \frac{Cp + (A+1)C2}{C1 + Cp + (A+1)C2}Vlp, 0 \quad (24)$$

According to the same development of formula as that in the first positive integration processing, a voltage Vlp,k of the operational amplifier 350 at the time when the second positive integration processing is repeated k times is represented by the following expression.

Math. 20

$$Vpl, k = (1 - \eta lp)^k(Vlp, 0 + Blp0) - Blp0 \quad (25)$$

$$\eta lp = \frac{C1}{C1 + Cp + (A+1)C2} \quad (26)$$

$$-\eta lp\, Blp0 = \frac{AC1}{C1 + Cp + (A+1)C2}(Vofop + Vb) \quad (27)$$

Operation of the second negative integration processing is explained. This processing is configured by a second negative charge accumulation/comparison step and a negative charge transfer step. In this processing, sp1 and sp3 of the polarity switching unit 36 are connected and a4 and b4 of the SW4 are connected. In the second negative charge accumulation/comparison step, a1 and b1 of the SW1 are connected and a2 and b2 of the SW2 are connected. When an output of the operational amplifier 350 is represented as Vln,0, electric charges Q2,0 and Qp,0 accumulated in the capacitor C2 and Cp are represented by expressions obtained by replacing Vsp,0 on the right sides of Expressions (2) and Expression (3) with Vln,0. Electric charges Q1,0 accumulated in the capacitor C1 are represented by the following expression (28).

Math. 21

$$Q1,0 = C1(Vref - Vref) = 0 \quad (28)$$

In the second negative charge transfer step, a2 and c2 of the SW2 are connected. When an output of the operational amplifier 350 at this time is represented as Vlna,1, electric charges Q2a,1 and Qpa,1 accumulated in the capacitor C2 and Cp are represented by expressions obtained by replacing Vspb,1 on the right sides of Expression (9) and Expression (10) with Vlna,1. In electric charges Q1a,1 accumulated in the capacitor C1, since connection of the SW1, the SW2, and the SW4 is the same as that in the first negative integration processing, Q1a,1 is represented by an expression obtained by replacing Vsnb,1 on the right side of Expression (19) with Vlna,1. A relational expression between Vlp,0 and Vlpa,1 is represented by the following expression.

Math. 22

$$-Q1a, 1 + Qpa, 1 - Q2a, 1 = -Q1, 1 + Qp,$$

$$1 - Q2, 1 - C1\left\{Vref + \frac{1}{A}Vlna, 1 - (Vofop + Vb)\right\} +$$

$$Cp\left\{-\frac{1}{A}Vlna, 1 + (Vofop + Vb)\right\} - C2\left\{\frac{A+1}{A}Vlna, 1 - (Vofop + Vb)\right\} =$$

$$Cp\left(-\frac{Vln, 0}{A} + Vofop + Vb\right) - C2\left\{\frac{A+1}{A}Vln, 0 - (Vofop + Vb)\right\}$$

$$\left(\frac{C1}{A} + \frac{Cp2}{A} + \frac{A+1}{A}C2\right)Vlna,$$

$$1 = C1(-Vref + Vofop + Vb) + \left(\frac{Cp2}{A} + C2\frac{A+1}{A}\right)Vln, 0$$

$$Vlna, 1 =$$

$$\frac{AC1}{C1 + Cp + (A+1)C2}(-Vref + Vofop + Vb) + \frac{Cp + (A+1)C2}{C1 + Cp + (A+1)C2}Vln, 0$$

A voltage Vln,1 of the operational amplifier 350 and Vlna1 at the time when the processing transitions to the second negative charge accumulation/comparison step again are equal. Therefore, a relational expression between Vln,1 and Vln,0 is represented by the following expression.

Math. 23

$$Vln, 1 = \frac{AC1}{C1 + Cp + (A+1)C2}(-Vref + Vofop + Vb) + \quad (29)$$

$$\frac{Cp + (A+1)C2}{C1 + Cp + (A+1)C2}Vln, 0$$

According to the same development of formula as that in the first positive integration processing, a voltage Vln,k of the operational amplifier 350 at the time when the second negative integration processing is repeated k times is represented by the following expressions.

Math. 24

$$Vln, k = (1 - \eta ln)^k(Vln, 0 + Bln0) - Bln0 \quad (30)$$

$$\eta ln = \frac{C1}{C1 + Cp + (A+1)C2} \quad (31)$$

$$-\eta ln\, Bln0 = \frac{AC1}{C1 + Cp + (A+1)C2}(-Vref + Vofop + Vb) \quad (32)$$

Processing in the calibration control unit 21 is explained below. The calibration control unit 21 is configured by an intermediate-voltage integrating unit 210, an intermediate-voltage-excess integrating unit 211, and a reference-voltage integrating unit 212.

Figure 2:
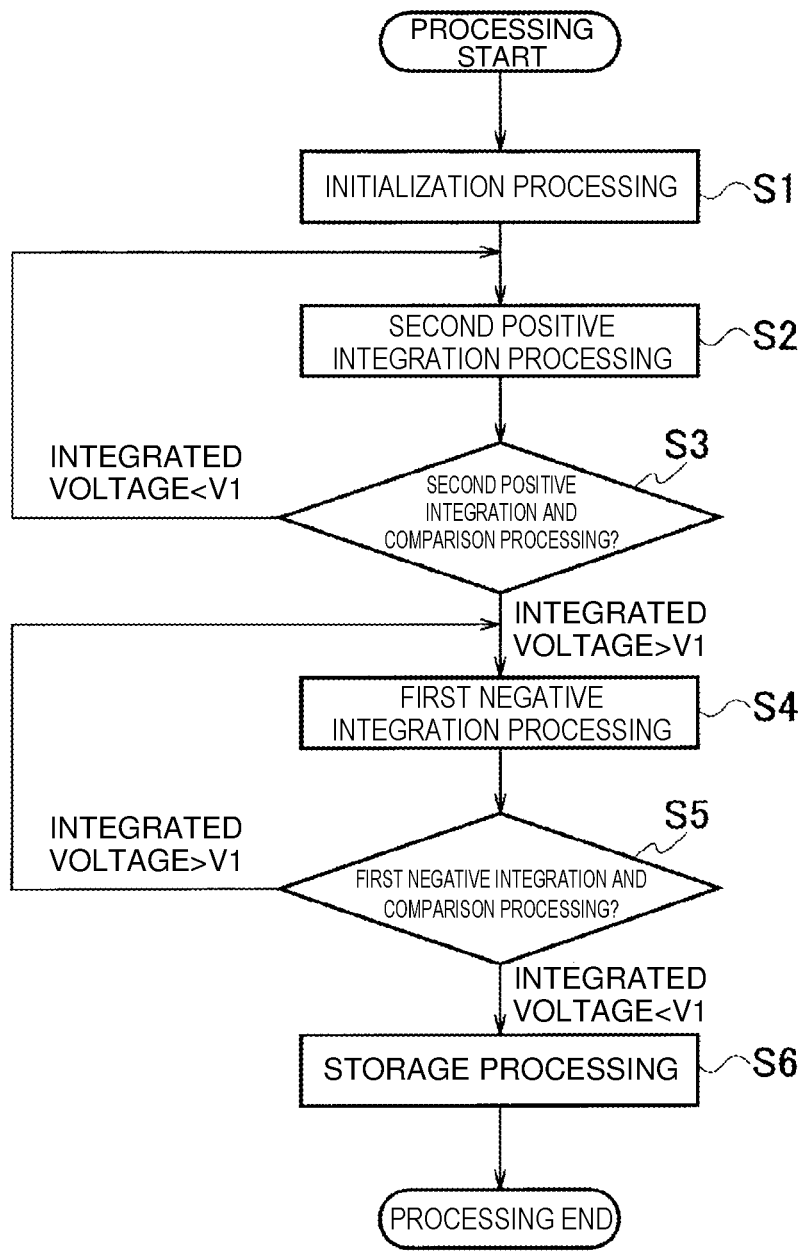
FIG. 2 is a flowchart showing a processing procedure of an intermediate-voltage integrating unit shown in FIG. 1.

A processing flow of the intermediate-voltage integrating unit 210 is shown in FIG. 2. When the processing is started, in initialization processing, the intermediate-voltage integrating unit 210 connects st1 and st3 of the determination-voltage switching unit 31 and performs connection and disconnection of the SW3 to reset electric charges accumulated in the capacitor C2 (step S1). Thereafter, the intermediate-voltage integrating unit 210 executes second positive integration processing (step S2) and second positive integration and comparison processing (step S3) until an integrated voltage Vo, which is an output voltage of the integrating unit 35, becomes larger than V1. In the second positive integration and comparison processing, the intermediate-voltage integrating unit 210 monitors an output of the determiner 33 in the case in which s11 and S13 of the crossbar switch 32 are connected and s12 and s14 of the crossbar switch 32 are connected and in the case in which s11 and s14 of the crossbar switch 32 are connected and s12 and s13 of the crossbar switch 32 are connected. The processing transitions to the next first negative integration processing (step S4) when the integrated voltage becomes larger than V1 in both the cases.

An offset voltage Vofc is present on a positive input side of the determiner 33. When s11 and s13 are connected and s12 and s14 are connected, a positive input of the determiner 33 is equivalently Vo+Vofc and a negative input of the determiner 33 is V1. A determination signal of an output of the determiner 33 is a low voltage signal when Vo is small and is a high voltage signal when Vo is large. When s11 and s14 are connected and s12 and s13 are connected, the positive input of the determiner 33 is equivalently V1+Vofc and the negative input of the determiner 33 is Vo. The determination signal is the high voltage signal when Vo is small and is the low voltage signal when Vo is large. Accordingly, the second positive integration processing and the second positive integration and comparison processing are executed until the determination signal becomes the high voltage signal when s11 and s13 are connected and s12 and s14 are connected and the determination signal becomes the low voltage signal when the s11 and s14 are connected and s12 and s13 are connected. When the number of times of the second positive integration processing at the time when Vo>V1 for the first time in both of the case in which s11 and s13 are connected and s12 and s14 are connected and the case in which s11 and s14 are connected and s12 and s13 are connected is represented as km21+1, km21 is defined as the number of times of intermediate potential second positive integration processing.

After the processing transitions to the first negative integration processing, the intermediate-voltage integrating unit 210 repeats the first negative integration processing (step S4) and the first negative integration and comparison processing (step S5) until Vo<V1 in both of the case in which the s11 and s13 are connected and s12 and s14 are connected and the case in which s11 and s14 are connected and s12 and s13 are connected.

Figure 3:
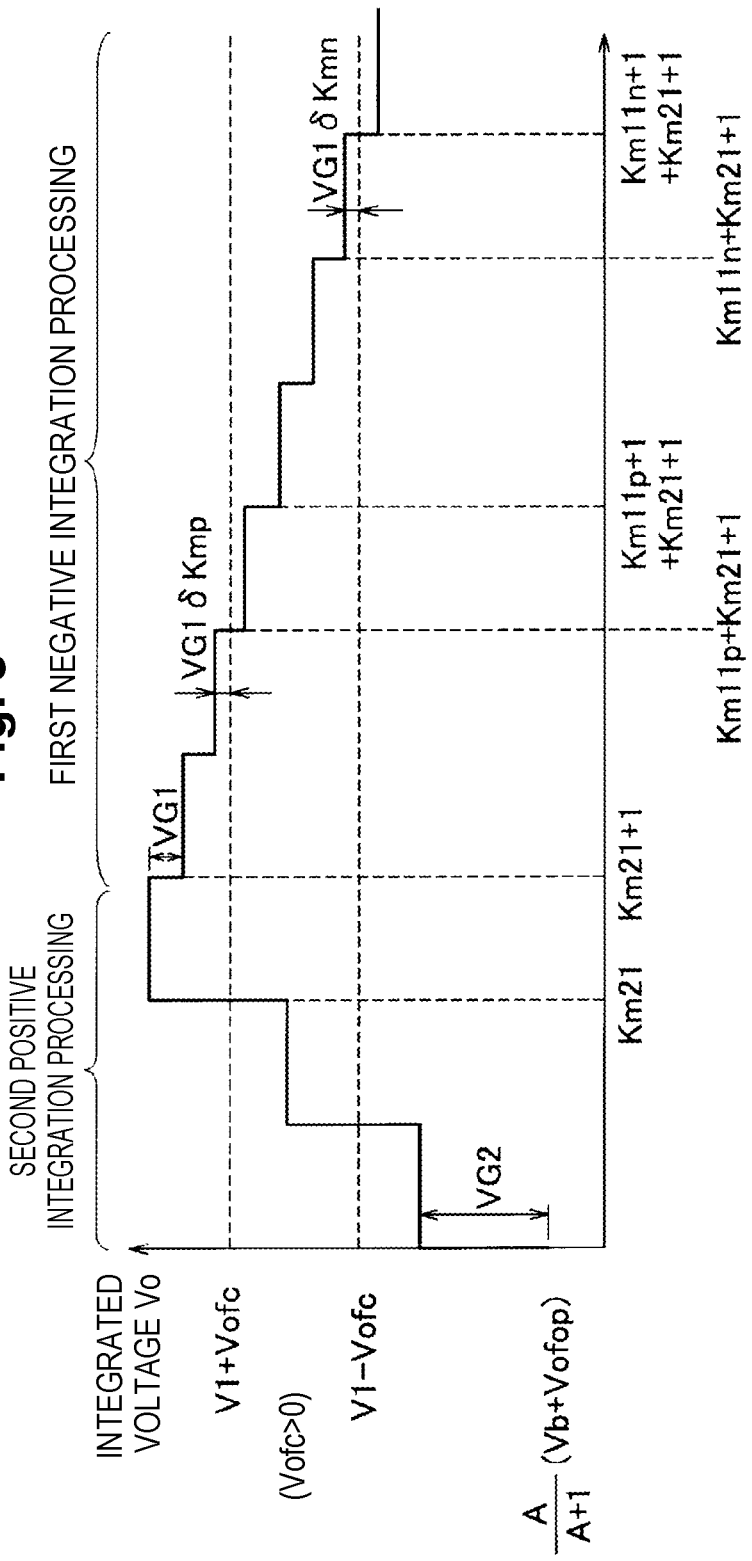
FIG. 3 is a diagram schematically showing a relation between the number of times of integration and an integrated voltage.

An example of a relation between an integrated voltage and the number of times of integration is shown in FIG. 3. A unit voltage in the second positive integration processing is represented as VG2 and a unit voltage in the first negative integration processing is represented as VG1. In FIG. 2, Vofc>0. After once Vo>V1+Vofc in the second positive integration processing, V1+Vofc>Vo according to the first negative integration processing. When the first negative integration processing is further continued, V1−Vofc>Vo. When the number of times of integration at the time when V1+Vofc>Vo for the first time according to the first negative integration processing after the number of times of integration is km21+1 is represented as km11p+1 (counted from km21+1), km11p is defined as the number of times of intermediate potential first negative integration processing 1.

An integrated voltage Vo at the time when, after the capacitor C2 is reset, the second positive integration processing is repeated km21+1 times and the first negative integration processing is repeated km11p times is calculated. Since this is the same operation as the operation of the unity gain buffer at the time when the capacitor C2 is reset, when an output of the operational amplifier is represented as Vlp,0, Vlp,0 is represented by the following expression.

Math. 25

$$Vlp,0 = \frac{A}{A+1}(Vofop + Vb) \qquad (33)$$

Vo is calculated by performing development of formula with Vsn,0 of Expression (21) as Vlp, km21+1. Vo is the following expression when development of formula is performed using Maclaurin's expansion with k1=km11p, k2=km21+1 and ηlp<<1 and ηsn<<1.

Math. 26

$$Vo = (1-\eta sn)^{k1}\{(1-\eta lp)^{k2}(Vlp,0+Blp0)-Blp0+Bsn0\}-Bsn0 =$$
$$(1-\eta sn)^{k1}(1-\eta lp)^{k2}(Vlp,0+Blp0)+(1-\eta sn)^{k1}(-Blp0+Bsn0)-Bsn0 =$$
$$(1-\eta sn\ k1-\eta lp\ k2)(Vlp,0+Blp0)+(1-\eta sn\ k1)(-Blp0+Bsn0)-$$
$$Bsn0 = Vlp,0+(-\eta lp\ k2)(Vlp,0+Blp0)+(-\eta sn\ k1)(Vlp,0+Bsn0) =$$
$$\frac{A}{A+1}(Vofop+Vb)+k2\left\{-\frac{C1}{C1+Cp+(A+1)C2}\frac{A}{A+1}(Vofop+Vb)+\right.$$
$$\frac{AC1}{C1+Cp+(A+1)C2}(Vofop+Vb)\right\}+k1\left\{-\frac{C1+Cp}{C1+Cp+(A+1)C2}\frac{A}{A+1}\right.$$
$$(Vofop+Vb)+\frac{AC1}{C1+Cp+(A+1)C2}\left\{-Vref+V1+\frac{1}{A+1}(Vofop+Vb)\right\}+$$
$$\frac{Cp}{C1+Cp+(A+1)C2}\frac{A}{A+1}(Vofop+Vb)\right\} = k2\frac{AC1}{C1+Cp+(A+1)C2}\frac{A}{A+1}$$
$$(Vofop+Vb)+k1\frac{AC1}{C1+Cp+(A+1)C2}(-Vref+V1)+\frac{A}{A+1}(Vofop+Vb)$$

$$Vo = k2\ VG2 - k1\ VG1 + Vofb \qquad (34)$$

$$VG2 = \frac{AC1}{C1+Cp+(A+1)C2}\frac{A}{A+1}(Vofop+Vb) \qquad (35)$$

$$VG1 = \frac{AC1}{C1+Cp+(A+1)C2}(Vref-V1) \qquad (36)$$

$$Vofb = \frac{A}{A+1}(Vofop+Vb) \qquad (37)$$

The following expression holds at the time when V1+Vofc=Vo.

Math. 27

$$V1+Volk=(km21+1)VG2-(km11p+\delta km11p)VG1+Vofb \qquad (38)$$

In Expression (38), δkm11p is a real number equal to or larger than 0 and smaller than 1 and represents a difference between an integrated voltage and Vref+Vofc at the time when VG1δkm11p is the number of times of integration km11p.

When the number of times of integration at the time when V1−Vofc>Vo for the first time according to the first negative integration processing after the number of times of integration is km21+1 is represented as km11n+1, km11n is defined as the number of times of intermediate potential first negative integration processing 2. The following expression holds at the time when V1−Vofc=Vo.

Math. 28

$$V1-Vofc=(km21+1)VG2-(km11n+\delta km11n)VG1+Vofb \quad (39)$$

Figure 4:
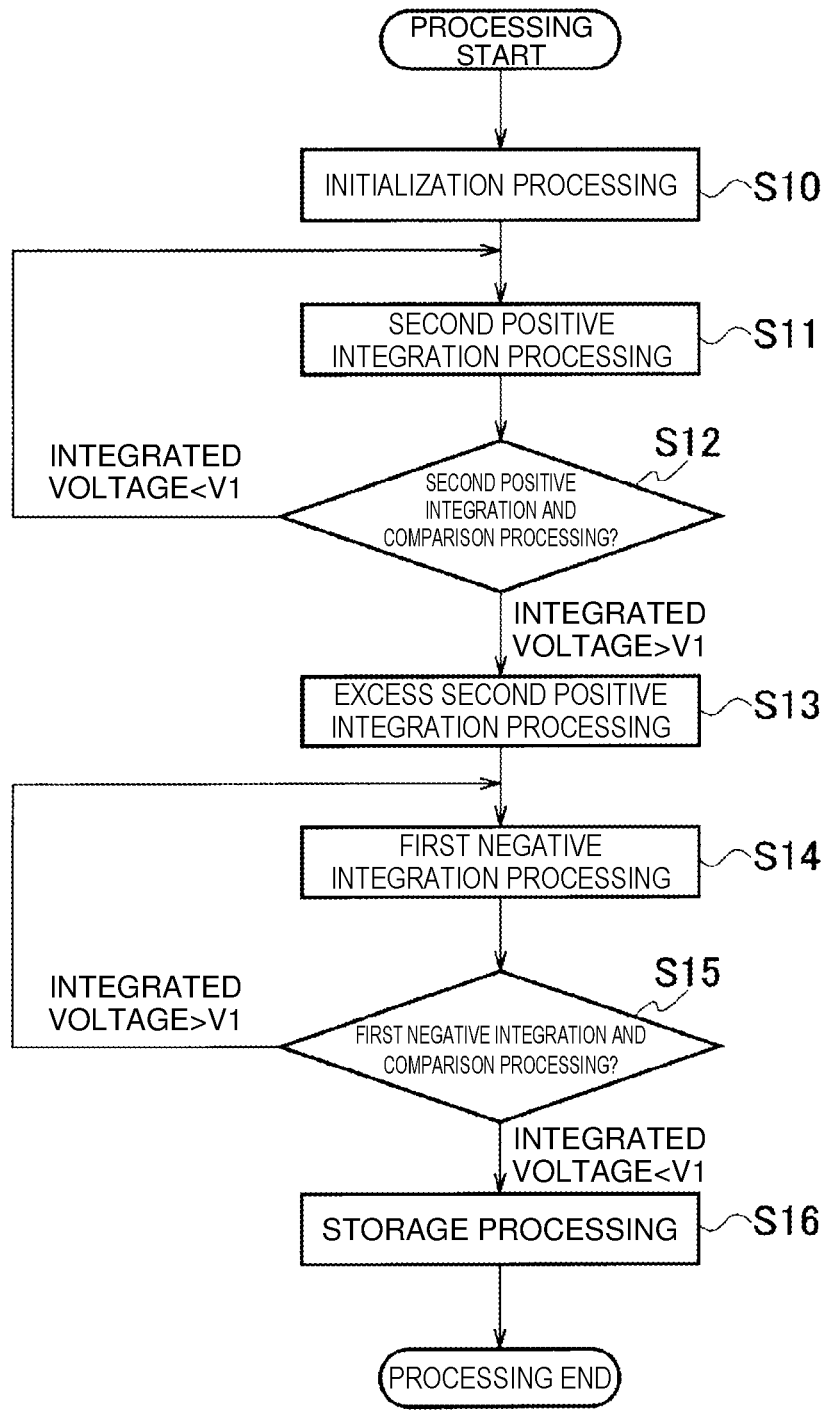
FIG. 4 is a flowchart showing a processing procedure of an intermediate-voltage-excess integrating unit shown in FIG. 1.

A processing flow of the intermediate-voltage-excess integrating unit 211 is shown in FIG. 4. This processing is different from the processing of the intermediate-voltage integrating unit 211 in that excess second positive integration processing (step S13) is carried out before first negative integration and comparison processing (step S15). Second positive integration processing is carried out in the excess second positive integration processing (step S13). Therefore, an expression that holds at the time when V1+Vofc=V0 and at the time when V1−Vofc=Vo is the following expression.

Math. 29

$$V1+Vofc=(km21+2)VG2-(km12p+\delta km12p)VG1+Vofb \quad (40)$$

$$V1-Vofc=(km21+2)VG2-(km12n+\delta km12n)VG1+Vofb \quad (41)$$

Figure 5:
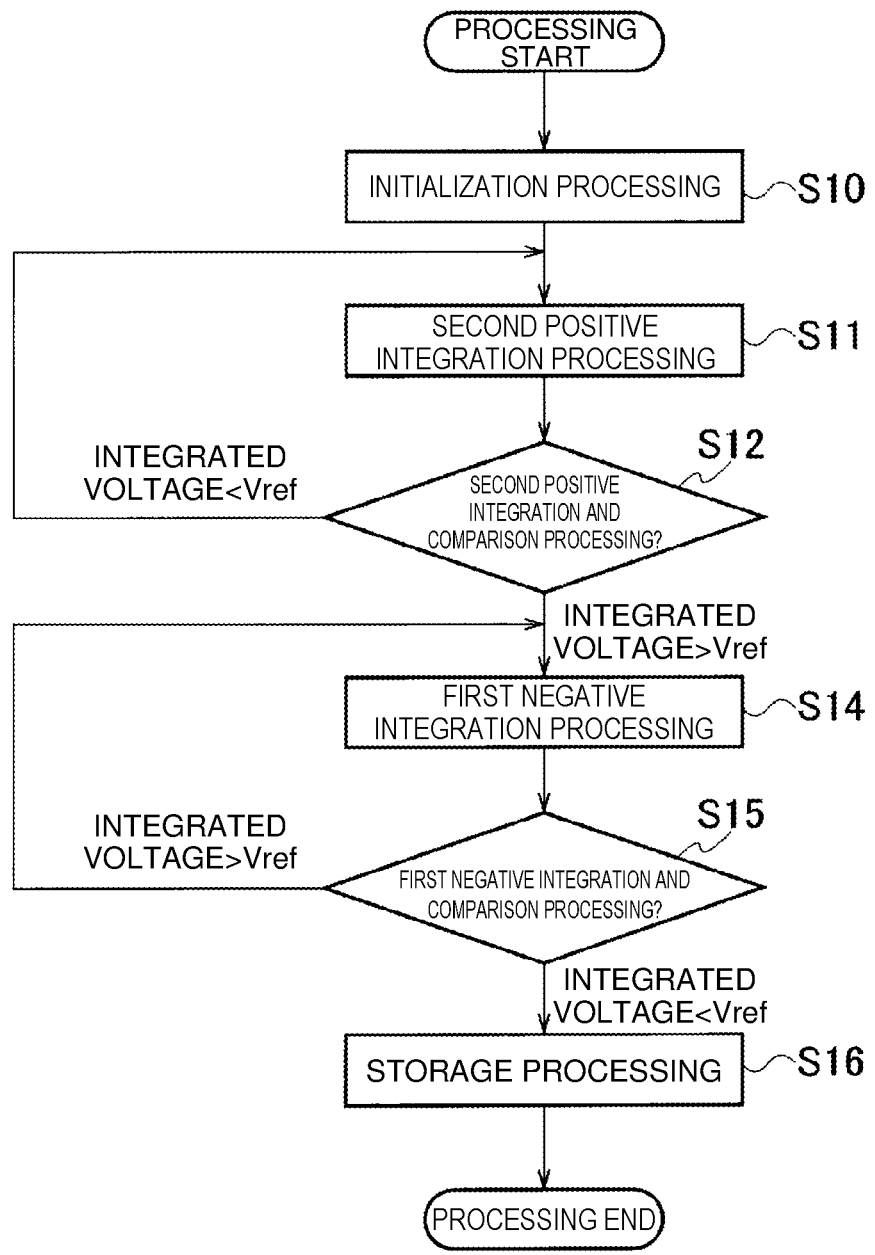
FIG. 5 is a flowchart showing a processing procedure of a reference-voltage integrating unit shown in FIG. 1.

A processing flow of the reference-voltage integrating unit 212 is shown in FIG. 5. This processing is different from the processing of the intermediate-voltage integrating unit 212 in processing for inputting a reference voltage to the determiner 33 and comparing an integrated voltage and the reference voltage. Accordingly, st1 and st2 of the determination-voltage switching unit 31 are connected in initialization processing. An expression that holds at the time when Vref+Vofc=Vo and at the time when Vref−Vofc=Vo is the following expression.

Math. 30

$$Vref+Vofc=(kr2+1)VG2-(kr1p+\delta kr1p)VG1+Vofb \quad (42)$$

$$Vref-Vofc=(kr2+2)VG2-(kr1n+\delta kr1n)VG1+Vofb \quad (43)$$

When the operations of the intermediate-voltage integrating unit 210, the intermediate-voltage-excess integrating unit 211, and the reference-voltage integrating unit 212 are completed, the reference-voltage integrating unit 212 derives calibration values of VG2 and VG1. Vofc is cancelled from Expression (38) according to Expression (43) to obtain the following expressions.

Math. 31

$$V1=(km21+1)VG2-Km11VG1+Vofb \quad (44)$$

$$V1=(km21+2)VG2-Km12VG1+Vofb \quad (45)$$

$$Vref=(kr2+1)VG2-Kr1VG1+Vofb \quad (46)$$

In Expression (44), Km11=(km11p+δkm11p+km11n+δkm11n)/2. In Expression (45), Km12=(km12p+δkm12p+km12n+δkm12n)/2. In Expression (46), Kr1=(kr1p+δkr1p+kr1n+δkr1n)/2. The following expression holds from Expression (35) and Expression (36).

Math. 32

$$\frac{VG2}{VG1} = \frac{Vofb}{Vref - Vi} \quad (47)$$

The following relational expression holds between VG1 and VG2 from Expression (44) and Expression (45).

Math. 33

$$0=VG2-(Km12-Km11)VG1$$

$$VG2=(Km12-Km11)VG1 \quad (48)$$

When Expression (48) is substituted in Expression (47), Expression (49) is obtained.

Math. 34

$$Vofb=(Km12-Km11)(Vref-V1) \quad (49)$$

When a difference between Expression (46) and Expression (44) is calculated, the following Expression (50) is obtained.

Math. 35

$$Vref-V1=(kr2-km21)VG2-(Kr1-Km11)VG1=(kr2-km21)(Km12-Km11)VG1-(Kr1-Km11)VG1 \quad (50)$$

An expression of VG1 is obtained by substituting Expression (50), Expression (49), and Expression (48) in Expression (46).

Math. 36

$$Vref = (kr2+1)(Km12-Km11)VG1 - Kr1VG1$$

$$+(Km12-Km11)\{(kr2-km21)(Km12-Km11)VG1 - (Kr1-Km11)VG1\}$$

$$VG1 = \frac{Vref}{\begin{array}{c}(kr2+1)(Km12-Km11) - \\ Kr1 + (Km12-Km11) \\ \{(kr2-km21)(Km12-Km11)-(Kr1-Km11)\}\end{array}}$$

$$= \frac{Vref}{\begin{array}{c}(kr2-km21)(Km12-Km11)^2 + \\ (kr2+1-Kr\ 1+Km11) \\ (Km12-Km11)-Kr1\end{array}} \quad (51)$$

Expressions of Vofb and VG2 are obtained as described below.

Math. 37

$$VG2 = \frac{(Km12-Km11)Vref}{\begin{array}{c}(kr2-km21)(Km12-Km11)^2 + \\ (kr2+1-Kr1+Km11)(Km12-Km11)-Kr1\end{array}} \quad (52)$$

$$Vofb = \frac{(Kr1-Km11)(Km12-Km11)}{\begin{array}{c}(kr2-km21)(Km12-Km11)^2 + \\ (kr2+1-Kr1+Km11) \\ (Km12-Km11)-Kr1\end{array}} Vref \quad (53)$$

Calibration values of VG1, VG2, and Vofb can be obtained according to km21, km11, km12, kr2, and kr1 obtained by the above processing.

When a variable reference voltage is output, the number of times of integration for enabling a voltage closest to a value requested by setting data to be output is calculated using the calibration values obtained by the calibration processing explained above and integration processing is executed. When the value requested by the setting data is a value larger than Vofb, the processing in a positive-voltage-integration processing unit 221 of the output control unit 22 is executed. When the value requested by the setting data is a value smaller than Vofb, the processing in a negative-voltage-integration processing unit 222 is executed.

Figure 6:
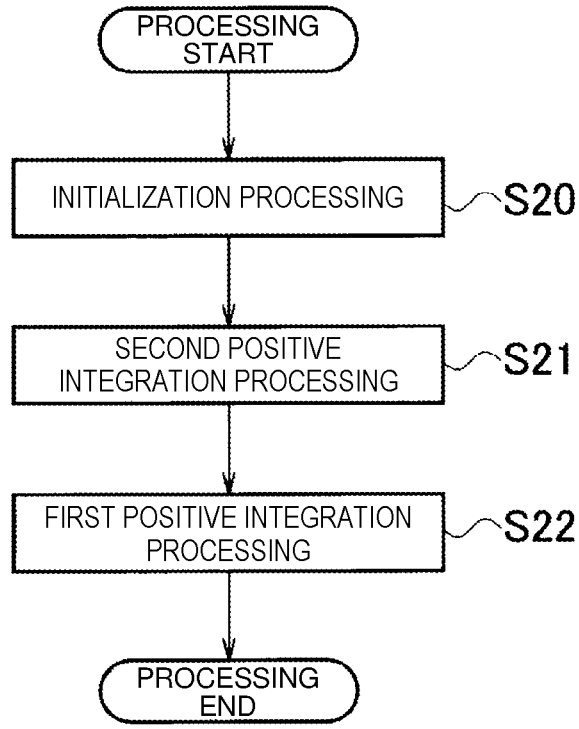
FIG. 6 is a flowchart showing a processing procedure of a positive-voltage-integration processing unit shown in FIG. 1.

A processing flow of the positive-voltage-integration processing unit 221 is shown in FIG. 6. In initialization processing, the positive-voltage-integration processing unit 221 performs connection and disconnection of the SW3 and resets electric charges accumulated in the capacitor C2 (step S20). Thereafter, the positive-voltage-integration processing unit 221 executes second positive integration processing (step S21) and first positive integration processing (step S22) by the numbers of times of integration k2 and k1 for enabling a voltage closest to a value requested by setting data calculated by the output control unit 22 to be output. The positive-voltage-integration processing unit 221 derives the integrated voltage Vo after the execution of these kinds of processing below. An initial value of the second positive integration processing (step S21) is the same as Expression (33). Since the first positive integration processing is executed k1 times after the second positive integration processing is executed k2 times, Vo is the following expression from Expression (25) and Expression (17).

Math. 38

$$Vo = (1 - \eta sp)^{k1}\{(1 - \eta lp)^{k2}(Vlp, 0 + Blp0) - Blp0 + Bsp0\} - Bsp0 = \quad (54)$$
$$(1 - \eta sp)^{k1}(1 - \eta lp)^{k2}(Vlp, 0 + Blp0) + (1 - \eta sp)^{k1}\{-Blp0 + Bsp0\} -$$
$$Bsp0 = (1 - k1 \ \eta sp - k2 \ \eta lp)(Vlp, 0 + Blp0) +$$
$$(1 - k1 \ \eta sp)\{-Blp0 + Bsp0\} - Bsp0 = Vlp, 0 -$$
$$k1 \ \eta sp(Vlp, 0 + Bsp0) - k2 \ \eta lp(Vlp, 0 + Blp0) =$$
$$\frac{A}{A+1}(Vofop + Vb) + k1\left\{-\frac{A}{A+1}(Vofop + Vb)\frac{C1+Cp}{C1+Cp+(A+1)C2} + \right.$$
$$\frac{AC1}{C1+Cp+(A+1)C2}\left\{Vref - V1 + \frac{A}{A+1}(Vofop + Vb)\right\} +$$
$$\left.\frac{C1}{C1+Cp+(A+1)C2}\frac{A}{A+1}(Vofop + Vb)\right\} +$$
$$k2\left\{-\frac{A}{A+1}(Vofop + Vb)\frac{C1}{C1+Cp+(A+1)C2} + \right.$$
$$\left.\frac{AC1}{C1+Cp+(A+1)C2}(Vofop + Vb)\right\} =$$
$$\frac{A}{A+1}(Vofop + Vb) + k1\frac{AC1}{C1+Cp+(A+1)C2}(Vref - V1) +$$
$$k2\frac{AC1}{C1+Cp+(A+1)C2}\frac{A}{A+1}(Vofop + Vb) = k2 \ VG2 + k1 \ VG1 + Vofb$$

Since the first positive integration processing is not executed in the calibration processing but the calibration values of VG2, VG1, and Vofb are obtained in the calibration processing, it is possible to output a known voltage if the processing of the positive-voltage-integration processing unit 221 is executed.

Figure 7:
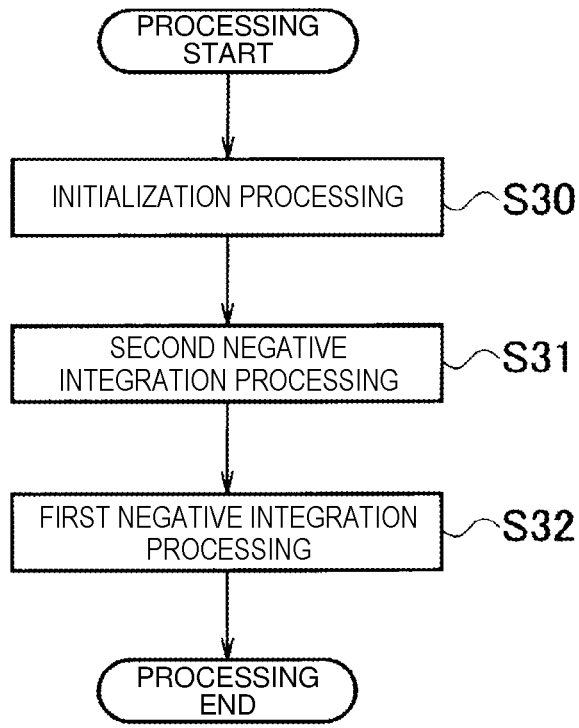
FIG. 7 is a flowchart showing a processing procedure of a negative-voltage-integration processing unit shown in FIG. 1.

A processing flow of the negative-voltage-integration processing unit 222 is shown in FIG. 7. In initialization processing, the negative-voltage-integration processing unit 222 performs connection and disconnection of the SW3 and resets electric charges accumulated in C2 (step S30). Thereafter, the negative-voltage-integration processing unit 222 executes second negative integration processing (step S31) and first negative integration processing (step S32) by the numbers of times of integration k2 and k1 for enabling a voltage closest to a value requested by setting data calculated by the output control unit 22 to be output. The negative-voltage-integration processing unit 222 derives the integrated voltage Vo in this case below. An initial value Vln,0 of the second negative integration processing is the same as the right side of Expression (33). Since the first negative integration processing is executed k1 times after the second negative integration processing is executed k2 times, Vo is the following expression from Expression (30) and Expression (21).

Math. 39

$$Vo = (1 - \eta sn)^{k1}\{(1 - \eta ln)^{k2}(Vln, 0 + Bln0) - Bln0 + Bsn0\} - Bsn0 =$$
$$(1 - \eta sn)^{k1}(1 - \eta ln)^{k2}(Vln, 0 + Bln0) + (1 - \eta sn)^{k1}\{-Bln0 + Bsn0\} - Bsn0 =$$
$$(1 - k1 \ \eta sn - k2 \ \eta ln)(Vln, 0 + Bln0) +$$
$$(1 - k1 \ \eta sn)\{-Bln0 + Bsn0\} - Bsn0 = Vln, 0 -$$
$$k1 \ \eta sn(Vln, 0 + Bsn0) - k2 \ \eta ln(Vln, 0 + Bln0) =$$
$$\frac{A}{A+1}(Vofop + Vb) + k1\left\{\frac{A}{A+1}(Vofop + Vb)\frac{C1+Cp}{C1+Cp+(A+1)C2} + \right.$$
$$\frac{AC1}{C1+Cp+(A+1)C2}\left\{-Vref - V1 + \frac{A}{A+1}(Vofop + Vb)\right\} +$$
$$\left.\frac{C1}{C1+Cp+(A+1)C2}\frac{A}{A+1}(Vofop + Vb)\right\} +$$
$$k2\left\{-\frac{A}{A+1}(Vofop + Vb)\frac{C1}{C1+Cp+(A+1)C2} + \right.$$
$$\left.\frac{AC1}{C1+Cp+(A+1)C2}(-Vref + Vofop + Vb)\right\} =$$
$$\frac{A}{A+1}(Vofop + Vb) + k1\frac{AC1}{C1+Cp+(A+1)C2}(-Vref + V1) +$$
$$k2\frac{AC1}{C1+Cp+(A+1)C2}\left\{-Vref + \frac{A}{A+1}(Vofop + Vb)\right\}$$
$$= k2 \ VG2m - k1 \ VG1 + Vofb \quad (55)$$
$$VG2m = \frac{AC1}{C1+Cp+(A+1)C2}\left\{-Vref + \frac{A}{A+1}(Vofop + Vb)\right\} \quad (56)$$

An integration unit VG2m of the second negative integration processing is correlated with VG2 by the following expression and can be calibrated by already obtained calibration values of VG2 and Vofb.

Math. 40

$$VG2m = \frac{-Vref + Vofob}{Vofb}VG2 \quad (57)$$

Therefore, it is possible to output the known voltage even in this case.

The variable reference voltage source 100 explained above is a variable reference voltage source that generates a variable reference voltage corresponding to setting data set from the outside. The variable reference voltage source 100 includes the control unit 20, the reference voltage unit 10 that outputs a reference voltage, and the integrated-voltage generating unit 30. The control unit 20 includes the calibration control unit 21 that controls operation for acquiring calibration data including calibration values of an offset voltage and a predetermined unit voltage of the determiner 33, which determines magnitudes of two voltages, and the output control unit 22 that controls operation for generating a variable reference voltage corresponding to setting data set from the outside based on the calibration data. The integrated-voltage generating unit 30 repeats, when the calibration control unit 21 controls the operation, an integrating operation until an integrated voltage obtained by integrating at least two or more kinds of unit voltages becomes equal to a reference voltage and outputs, when the output control unit 22 controls the operation, a variable reference voltage corresponding to the setting data. Consequently, it is possible to provide a variable reference voltage source for which a measuring instrument for calibration is unnecessary on the outside.

The variable reference voltage source 100 according to this embodiment can calibrate itself with remote operation without requiring a measuring instrument for calibration. Therefore, the variable reference voltage source 100 of the present invention is suitably used in combination with a large number of sensor circuits present in remote locations.

That is, even if an operator does not visit sites where a large number of sensor circuits are disposed, it is possible to calibrate, with remote operation, a variable reference voltage used by the respective sensor circuits.

Note that the present invention is not limited to the embodiment explained above. Modifications of the present invention are possible within a range of the gist described in claims.

REFERENCE SIGNS LIST

10 Reference voltage unit
20 Control unit
21 Calibration control unit
22 Output control unit
30 Integrated-voltage generating unit
31 Determination-voltage switching unit
32 Crossbar switch
33 Determiner
34 Threshold generating unit
35 Integrating unit
36 Polarity switching unit
210 Intermediate-voltage integrating unit
211 Intermediate-voltage-excess integrating unit
212 Reference-voltage integrating unit
221 Positive-voltage-integration processing unit
222 Negative-voltage-integration processing unit

The invention claimed is:

1. A variable reference voltage source that generates a variable reference voltage corresponding to setting data set from outside, the variable reference voltage source comprising:
a control unit including a calibration control unit that controls operation for acquiring calibration data including calibration values of an offset voltage and a predetermined unit voltage of a determiner, which determines magnitudes of two voltages, and an output control unit that controls operation for generating, based on the calibration data, a variable reference voltage corresponding to the setting data set from the outside;
a reference voltage unit that outputs a reference voltage; and
an integrated-voltage generating unit that repeats, when the calibration control unit controls the operation, an integrating operation until an integrated voltage obtained by integrating at least two or more kinds of unit voltages becomes equal to the reference voltage and outputs, when the output control unit controls the operation, the variable reference voltage corresponding to the setting data.

2. The variable reference voltage source according to claim 1, wherein the integrated-voltage generating unit includes:
an integrating unit that can set the at least two or more kinds of unit voltages having different magnitudes and polarities and generates an integrated voltage obtained by integrating the unit voltages;
the determiner that includes positive and negative inputs, determines, when the calibration control unit controls the operation, that a positive input voltage exceeds a negative input voltage;
a crossbar switch used for measurement of an offset voltage of the determiner;
a threshold generating unit that generates a bias voltage and an intermediate potential of the integrating unit;
a determination-voltage switching unit that switches, when the calibration control unit controls the operation, a voltage serving as a reference given to the determiner through the crossbar switch; and
a polarity switching unit that switches the polarities of the unit voltages.

3. The variable reference voltage source according to claim 2, wherein the integrating unit includes:
an operational amplifier including positive and negative inputs;
a first capacitor charged by the unit voltages;
a second capacitor that retains the integrated voltage obtained by integrating the unit voltages;
a fourth switch that causes the operational amplifier to operate as a unity gain buffer when one terminal of the first capacitor is connected to the negative input of the operational amplifier;
a third switch that short-circuits both ends of the second capacitor;
a first switch that connects an other terminal of the first capacitor to the intermediate potential or the reference voltage; and
a second switch that connects the one terminal of the first capacitor to the reference voltage or the negative input of the operational amplifier.

4. The variable reference voltage source according to claim 3, wherein, in a connected state of the first switch of the integrating unit,
when absolute values of the unit voltages are large, the other terminal of the first capacitor and the reference voltage are connected at both of an accumulation time of electric charges in the first capacitor and a transfer time of the accumulated electric charges to the second capacitor,
when the absolute values of the unit voltages are small and the polarities are positive, the other terminal of the first capacitor and the reference voltage are connected at the accumulation time of the electric charges in the first capacitor and the other terminal of the first capacitor and the intermediate potential are connected at the transfer time of the accumulated electric charges to the second capacitor, and
when the absolute values of the unit voltages are small and the polarities are negative, the other terminal of the first capacitor and the intermediate potential are connected at the accumulation time of the charges in the first capacitor and the other terminal of the first capacitor and the reference voltage are connected at the transfer time of the accumulated electric charges to the second capacitor.

5. The variable reference voltage source according to claim 4, wherein the calibration control unit includes an intermediate-voltage integrating unit that causes the integrated-voltage generating unit to repeat, until an integrated voltage obtained by integrating a first unit voltage having a positive polarity and a small absolute value becomes larger than the intermediate potential, operation in which the second capacitor integrates the first unit voltage, and, thereafter, repeat operation for discharging the integrated voltage at a second unit voltage having a negative polarity and a small absolute value and discharging the integrated voltage at the second unit voltage until the integrated voltage becomes smaller than the intermediate potential.

6. The variable reference voltage source according to claim 4, wherein the calibration control unit includes an intermediate-voltage-excess integrating unit that causes the integrated-voltage generating unit to repeat, until an integrated voltage obtained by integrating a third unit voltage having a positive polarity and a large absolute value becomes larger than the intermediate potential, operation in which the second capacitor integrates the third unit voltage, and, thereafter, repeat operation for discharging the integrated voltage at a second unit voltage having a negative polarity and a small absolute value and discharging the integrated voltage at the second unit voltage until the integrated voltage becomes smaller than the intermediate potential.

* * * * *